United States Patent [19]

Kowalevskii et al.

[11] Patent Number: 5,777,863
[45] Date of Patent: Jul. 7, 1998

[54] LOW-FREQUENCY MODULATED CURRENT MODE POWER SUPPLY FOR MAGNETRON SPUTTERING CATHODES

[75] Inventors: Dmitri Kowalevskii; Michael Kishinevsky, both of Madison, Wis.

[73] Assignee: Photran Corporation

[21] Appl. No.: 664,129

[22] Filed: Jun. 14, 1996

[51] Int. Cl.[6] .................................................. H02M 7/02
[52] U.S. Cl. .......................................................... 363/63
[58] Field of Search .................................. 363/15, 16, 63, 363/95, 97, 131; 315/5.13, 111.21

[56] References Cited

U.S. PATENT DOCUMENTS

| | | | |
|---|---|---|---|
| 5,208,432 | 5/1993 | Han | 219/10.55 B |
| 5,303,139 | 4/1994 | Mark | 363/63 |
| 5,347,236 | 9/1994 | Neuharth et al. | 331/87 |
| 5,571,439 | 11/1996 | Daley et al. | 219/716 |
| 5,642,268 | 6/1997 | Pratt et al. | 363/17 |

*Primary Examiner*—Matthew V. Nguyen
*Attorney, Agent, or Firm*—R. Russel Austin

[57] ABSTRACT

A power supply for driving two magnetron sputtering devices in a bipolar mode includes current pulse circuits one for driving each of the two magnetrons. Each of the current pulse circuits converts positive and negative voltage outputs of a DC electrical power source to a train of regulated current pulses of independently adjustable duration. Each of the current pulse circuits includes a circuit block for converting the DC output voltage to a source of regulated current and delivering that regulated current to an input end of an inductor. Each of the current pulse circuits also includes an output switching circuit block which periodically and alternatively switches an output terminal between an output end of the inductor and the positive voltage output of the DC power source. The power supply may be configured to drive one magnetron in a unipolar mode alone or as an alternative to driving two magnetrons in a bipolar mode. A current pulse circuit may be used independently to provide a current pulse train from a DC voltage source for driving a device other than a magnetron. The current converting and regulating circuit block may be used independently for providing a regulated current source from a DC voltage source.

10 Claims, 6 Drawing Sheets

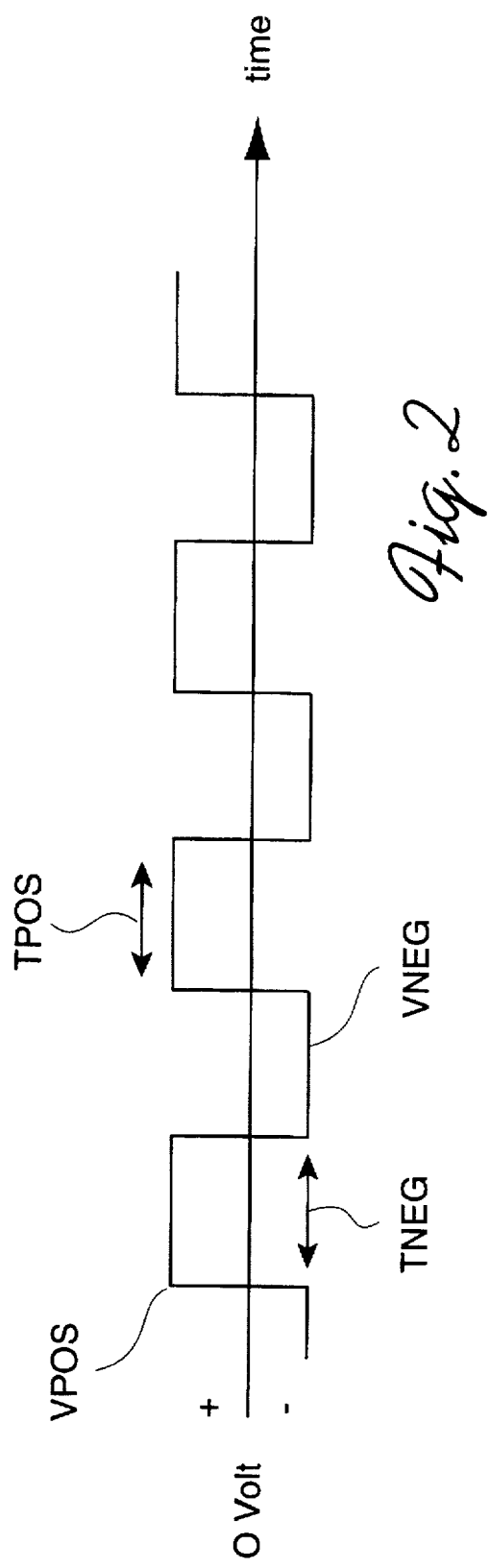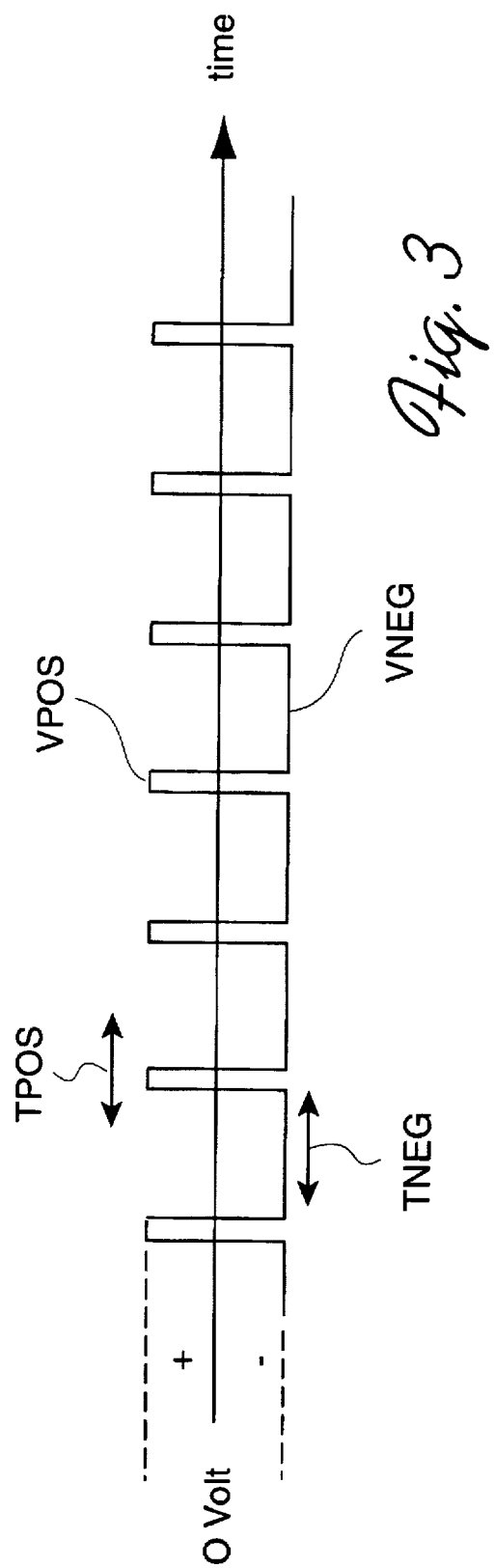

LOW-FREQUENCY MODULATED CURRENT MODE POWER SUPPLY FOR MAGNETRON SPUTTERING CATHODES

BACKGROUND OF THE INVENTION

The preset invention relates in general to power supplies for vacuum deposition equipment. The invention relates in particular to a pulse or modulated current power supply for magnetron sputtering devices used for sputter deposition of materials in vacuum.

Prior art magnetron power supplies are typically designed to be operated in of two modes. A first of these modes may be described as a bipolar mode. In the bipolar mode, an AC power supply is arranged to drive magnetron sputtering devices (magnetrons) cyclically such that when one of the cathodes is at a negative potential creating a sputtering discharge and functioning as a cathode of the discharge, the other is at a positive potential and functions as an anode of the discharge.

In a unipolar mode, a DC power supply drives only one magnetron, the magnetron being maintained for the most part at a negative potential (the discharge voltage), while periodically and regularly having reverse bias applied thereto such that its potential is driven positive. Typically, the length of periods at which the cathode is at negative potential are significantly longer than the periods at which the cathode is at positive potential.

A problem with prior art power supply types is that they are voltage sources. AC power supplies provide generally sinusoidally varying voltage. Because of this, in order to provide a high average power, a significantly higher peak power must be provided, and thus a high peak voltage. This high peak voltage requirement can necessitate high circuit component cost. Another problem related to voltage sources is that of arcing. A voltage source typically has one or more capacitors connected to its output. During an arc, these capacitors supply very high current, and all of their stored energy is released into the arc.

When operating in a unipolar mode, prior art power supplies do not permit a relatively low positive bias voltage to be applied. The term relatively, here, being used with reference to ground potential. Typically, applied positive voltage is equal in magnitude to applied negative (discharge) voltage.

There is clearly a need for a relatively inexpensive modulated power supply for magnetron cathodes, which can operate at high frequency, for example between about twenty and one-hundred Kilohertz (KHz) in both bipolar and unipolar operating modes, with reduced risk of arcing. Preferably, when operating in a bipolar mode, such a power supply should be capable of independent control of power applied to each of the driven cathodes and the time during which it is applied. When operating in a unipolar mode, it is preferable that magnetron potential is alternately switched between positive and negative potentials. In either mode, it is preferable that discharge and positive bias voltage are relatively constant while being applied to a magnetron.

SUMMARY OF THE INVENTION

The present invention is directed to apparatus for supplying electrical power to first and second magnetron sputtering devices operating cooperatively in a bipolar mode, or, alternatively, to only a third magnetron sputtering device operating in a unipolar mode. The apparatus supplies a device connected thereto with a train of current pulses which may also be defined as a modulated current output. The train of pulses has a generally square-wave waveform.

In one aspect, apparatus in accordance with the present invention comprises first and second output terminals supplied by independently controllable first and second sources of modulated regulated electrical current. The first and second terminals are for connecting the apparatus to respectively the first and second magnetrons when operating the magnetrons cooperatively in a bipolar mode. The apparatus also includes a third output terminal supplied by the first and second sources of modulated electrical current. The third terminal is for connecting to the third magnetron when operating only the third magnetron in a unipolar mode.

Preferably, the modulated regulated electrical current is in the form of a train of sequentially positive and negative going current pulses. Preferably, the apparatus also includes a fourth terminal, the fourth terminal for connecting to an electrode serving as an anode for the third magnetron when operating the magnetron in a unipolar mode. The fourth terminal is connected to an anode switching circuit, which is controllable for applying negative electrical potential to the fourth terminal when a positive going pulse is provided to the third terminal.

In one preferred embodiment, the apparatus comprises first and second current pulse circuits each thereof connected at an input end thereof to a source of DC electrical power at a positive voltage output thereof and at a negative voltage output thereof. A programmable control device is connected to at least the first and second current pulse circuits.

The first current pulse circuit is connectable at an output end thereof to the first magnetron sputtering device. The second current pulse circuit is connectable at an output end thereof to the second magnetron sputtering device.

Each of the first and second current pulse circuits is arranged to convert the positive and negative voltage outputs of the DC electrical power source to respectively first and second trains of sequentially positive and negative going regulated electrical current pulses. The current pulses are for applying sequentially positive electrical potential and negative electrical potential to a corresponding one of the first and second magnetrons. Each of the positive going pulses has a first pulse duration, and each of the negative going pulses has a second pulse duration, and sequential positive and negative going, pulses have a switching time therebetween. The control circuit is programmed such that for each of the current pulse circuits, the first and second pulse durations and the switching time therebetween are independently adjustable;

The first and second current pulse circuits are connectable at the output ends thereof to a common output terminal. This common output terminal is connectable to the third magnetron, and the current pulse circuits are controllable to deliver a third train of positive and negative going current pulses, via the common output terminal, to the third magnetron, for applying sequentially a positive and a negative potential thereto.

One preferred embodiment of a current pulse circuit in accordance with the present invention preferably includes a circuit block for converting voltage output from a source of DC power to a supply of regulated direct current. The voltage converting circuit block has first and second inputs connected to respectively negative and positive voltage outputs of the DC power source. The voltage conversion circuit block includes a output inductor. This inductor is connected periodically via current regulating circuitry in the circuit block to the negative voltage output of the DC electrical power source.

The current pulse circuit also includes an output switching circuit block having first and second input means connected respectively to an output end of the output inductor of the voltage conversion circuit block and to the positive voltage output of the DC electrical power source. The output switching circuit block has output means connectable to a magnetron to be driven, and includes means for alternatively and periodically switching the output means thereof to the output end of the inductor, or to the positive voltage output of said DC electrical power source. The periodic switching by the output circuit block provides a train of current pulses at the output means thereof.

Those skilled in the art to which the present invention pertains will recognize that while the present invention is summarized above in terms of a magnetron power supply configured for operating, alternatively, two magnetrons in a bipolar mode, or one magnetron in a unipolar mode, this configuration is not restricting. Those skilled in the art will recognize that novel features of the invention are applicable to providing an apparatus which is configured to operate only in a bipolar mode, or only in a unipolar mode.

Those skilled in the art will also recognize that while the invention has been described as apparatus for driving one or more magnetron sputtering devices, in a simplest aspect, it can be considered as simply a means for providing a train of regulated current pulses of adjustable duty cycle and frequency from a DC source of electrical power, which may be an unregulated such source. The pulses need not be positive and negative going as described but may be of the same polarity, and may be used for driving any device for which such an electrical current pulse train provides a suitable driving means.

It will also be recognized that the above described voltage conversion block may be used with the DC source of electrical power and the programmable control device to form apparatus which simply provides a source of regulated current from a voltage source. Such a source may be used to supply an electrically driven device which requires an essentially continuous current supply.

BRIEF DESCRIPTION OF THE DRAWINGS

The accompanying drawings, which are incorporated in and constitute a part of the specification, schematically illustrate a preferred embodiment of the invention and, together with the general description given above and the detailed description of the preferred embodiment given below, serve to explain the principles of the invention.

FIG. 2 is a timing diagram schematically illustrating output waveform in a bipolar operating mode of the power supply of FIG. 1.

FIG. 3 is a timing diagram schematically illustrating output waveform in a unipolar operating mode of the power supply of FIG. 1.

DETAILED DESCRIPTION OF THE INVENTION

Figure 1:
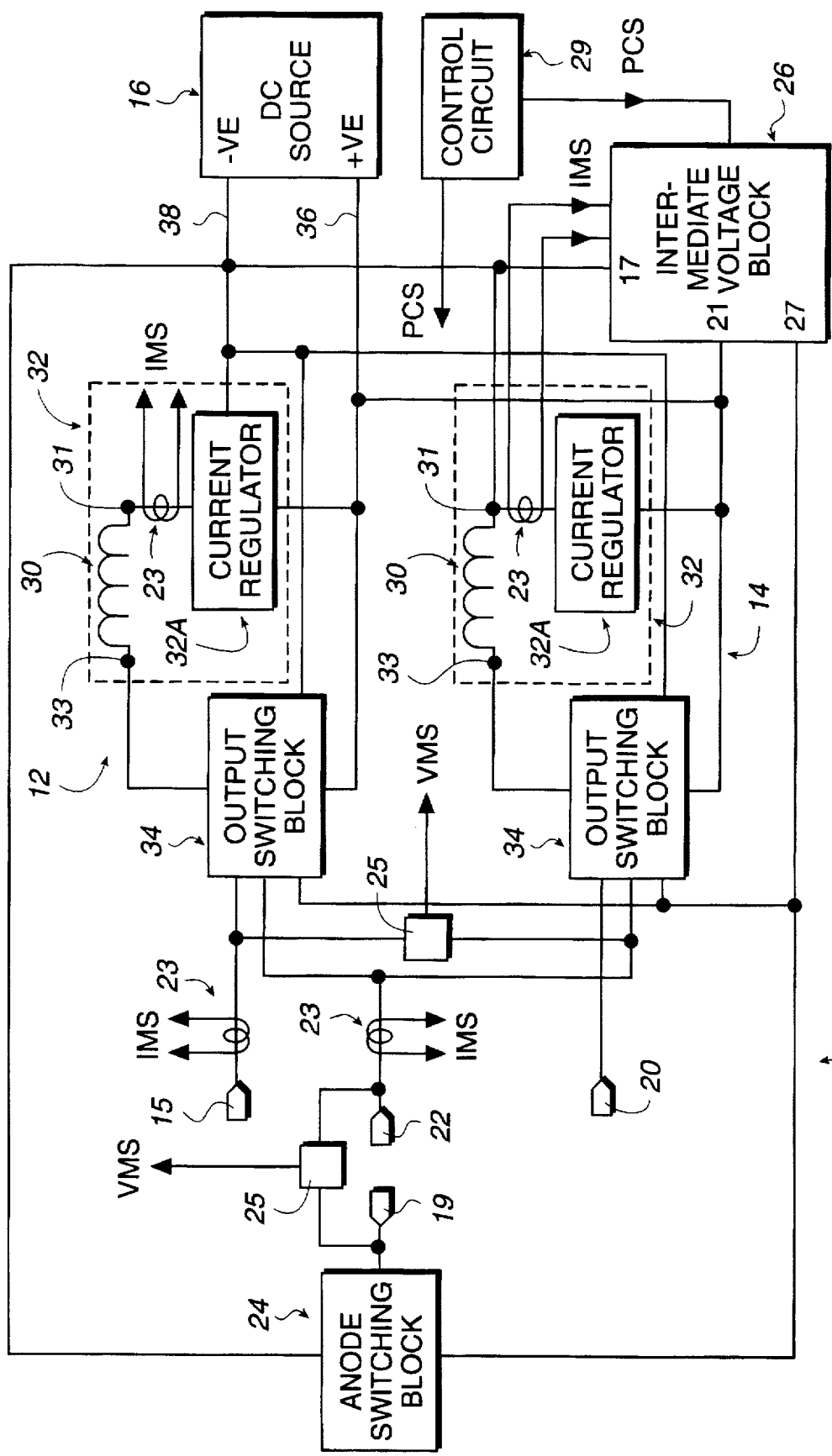
FIG. 1 is a block diagram schematically illustrating a preferred embodiment of a power supply in accordance with the present invention.

Turning now to the drawings, wherein like components are designated by like reference numerals, FIG. 1 illustrates major component groups and interconnections thereof for one preferred embodiment 10 of a power supply in accordance with the present invention. Power supply 10 is designed to drive two magnetron sputtering devices cooperatively in a bipolar mode, or only one magnetron sputtering device in a unipolar mode, with controlled or regulated current output in both modes.

Referring now to FIGS. 2 and 3, generally square-wave, output waveforms of power supply 10 in respectively the bipolar mode and unipolar mode of operation are schematically illustrated. Power supply 10 is configured, as described hereinafter, such that in the bipolar mode (see FIG. 2), for each magnetron, the time period of alternate half-cycles (TPOS and TNEG), which may be referred to as the duty cycle, is independently adjustable. Parameters controlled by the power supply 10 include TPOS and TNEG and corresponding currents IPOS and INEG (not shown in FIGS. 2 and 3). The magnitude or level of these currents are controlled for both magnetrons in a bi-polar mode, and for the one magnetron in a unipolar mode. Voltages VNEG and VPOS are set by conditions of the sputtering discharge and can not be externally controlled. Output power delivered to any of the magnetrons is controlled by adjusting the level of controlled or regulated current in accordance with instantaneous discharge voltage.

Continuing with reference to FIG. 1, power supply 10 includes two independent legs 12 and 14, each thereof supplied by a source 16 of DC electrical power. Legs 12 and 14 may be described as regulated current pulse circuits or simply as current pulse circuits. DC source 16 may be any prior art source capable of delivering at least the highest voltage required of power supply 10, and may even be an unregulated rectified AC source.

In a bipolar operating mode, output ends or terminals 18 and 20 of legs 12 and 14 respectively are each connected to a magnetron. Each leg delivers sequentially a positive going and a negative going current pulse to the magnetron with which it is connected. Timing and duration of pulse outputs from legs 12 and 14 is discussed in further detail hereinafter.

In a unipolar mode, both legs have their outputs connected to the same magnetron via a common output terminal 22. An anode switching block 24, in the unipolar mode, periodically applies reverse bias by connecting the negative output of DC source 16 via terminal 19, to an anode of the cathode being driven by power supply 16. Frequently, such an anode is simply a wall of a vacuum system in which the cathode is being driven. Magnetrons and their mode of connection in vacuum deposition systems are well known to those familiar with the art to which the present invention pertains. Accordingly, such magnetrons, corresponding anode(s), systems and connections thereof are not described or depicted herein.

In prior art bipolar magnetron operation, using prior art, voltage-controlled power supplies, it is arranged that the two driven magnetrons always have opposite polarity, i.e., the length of the positive portion of a duty cycle for one magnetron is the length of the negative duty cycle for the other. Thus the duty cycles of each are not independently adjustable. This limitation of prior art magnetron power supplies presents a problem if it is required that each of the bipolar driven magnetrons sputter a different material. This may be required, for example, to form a layer including a mixture or compound of the different materials. This limitation is also a problem if the driven magnetrons are sputtering the same material but are of a different configuration.

Figure 4:
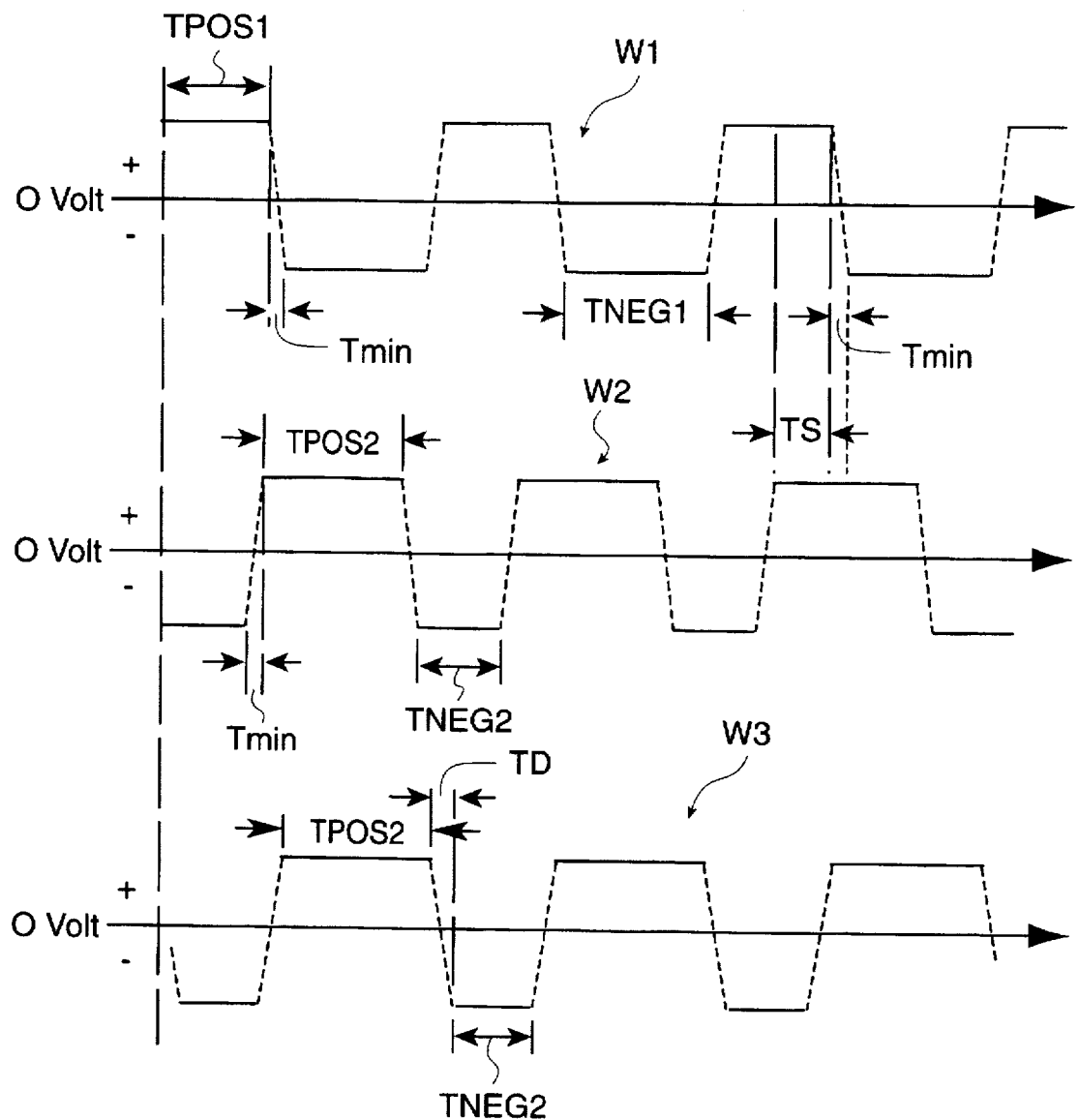
FIG. 4 is a timing diagram schematically illustrating details of waveforms supplied by the power supply of FIG. 1, for driving two magnetrons with different duty cycles in a bipolar mode

As noted above, a power supply in accordance with the present invention provides for independently adjustable duty cycles for each magnetron. While this has the advantage of providing for optimum sputtering conditions for each of two materials being sputtered, different duty cycles can lead to periods within corresponding duty cycles of each magnetron where both magnetrons have the same polarity, and no sputtering from either magnetron occurs. This may be conveniently termed "dead time". This is schematically illustrated in FIG. 4, wherein waveforms W1 and W2 represent bipolar-mode outputs from terminals 18 and 20 respectively of power supply 10. In each curve there is a minimum switching time (Tmin), imposed by circuit response times for switching from one polarity to the opposite polarity. During this time, there is significantly reduced current flow between magnetrons connected to terminals 18 and 20 and thus no significant sputtering occurs.

Waveforms W1 and W2 are generated, in effect, by current-pulse trains provided by legs 12 and 14, and have duty cycles defined respectively by positive half-cycle times, or current-pulse durations TPOS1 and TPOS2 and negative half-cycle times or current-pulse durations TNEG1 and TNEG2. Simply stated, the current pulse generation is achieved by periodically switching output terminals 18 and 20 between an output end 33 (which is at a negative potential when current is flowing therein) of an output inductor 30, and positive terminal or positive voltage output 36 of DC power source 16. If these half cycle times are different in W1 and W2, it can lead to significant fractions of corresponding cycles of W1 and w2 where both magnetrons have the same polarity. This is illustrated in FIG. 4 by the interval TS, wherein the polarity of W1 and W2 is positive. During this time there would be no sputtering from either magnetron. In a worst case, with W1 and W2 at a different duty cycle frequency, a result could be that average sputtering rates from the magnetrons would periodically vary.

In power supply 10 it is arranged that switching time (from positive to negative) of either W1 or W2 can be varied and controlled. It can be extended, for example, from minimum value Tmin to a value which is arranged such that each of the waveforms has the same frequency and, as a result, sputtering rates remain constant for both magnetrons, even though TPOS and TNEG for each ar different. This is illustrated in FIG. 4, where waveform W2 is transformed to waveform W3 by extending switching time between positive and negative half cycles from Tmin to a longer value TD. As such, a duty cycle of an output waveform may be defined a cycle of duration TPOS+TNEG+TD.

It should be noted here that the positive voltage on either magnetron would be relatively low with respect to ground potential electrode or system anode, which, as noted above, is frequently a wall of a vacuum chamber in which the magnetrons are operating. Because of this, in periods when both magnetrons have this positive voltage there would not be any significant current flow between the magnetrons, or between either magnetron and ground. When both magnetrons have a negative voltage, which is relatively high with respect to the positive magnetron voltage and ground there is no significant current flow between the magnetrons, and, because of typically high plasma resistance between the magnetrons and ground, no significant current flow occurs between either magnetron and ground. In the bipolar mode, significant current flow (and resulting sputtering) only occurs between corresponding magnetrons and only occurs when the magnetrons are switched on and have opposite polarity, i.e., when current is controlled. Because of this, sputtering rate is effectively controlled.

Continuing now with reference again to FIG. 1, circuitry and interconnections for accomplishing above described polarity switching and current regulation are described. Each of the legs 12 and 14 include an inductor 30, an input switching block, or current regulation block 32 and an output switching block 34. Current regulation block 32 may also be defined as a voltage conversion block, as it has the function of converting the voltage output of DC electrical power source 16 to regulated current output.

Current regulation block 32 includes output inductor 30 which is connected at an input end 31 thereof to circuitry 32A of the current regulation block, and at an output end 33 thereof to output switching block 34. In each leg, circuitry 32A delivers a regulated current supply to output inductor 30 of current regulation block 32. Output switching block 34 switches terminal 18 (or 20) between the output end 33 of output inductor 30 (which is at a negative potential) and positive output 36 of DC source 16, thereby generating a current pulse train at terminal (18 or 20) having positive and negative going half cycles, and being of a generally "square-wave" form, i.e., with voltage substantially constant during each current pulse.

Circuitry 32A of current regulation block 32 is controlled in such a way that it keeps current (or power) flowing through output inductor 30 at a preset level. Switch timing of the output switching block 34 depends on whether power supply 10 is being operated in the bipolar or the unipolar mode. In the unipolar mode it is preferred that output waveforms from legs 12 and 14 are synchronized such they are simultaneously positive and negative going and have equal TPOS, TNEG, and TD.

In the bipolar mode of operation (two cathodes being driven and maintaining a sputtering discharge), output switching blocks 34 in both legs 12 and 14 may be so timed that, at any given instant, one of the cathodes is connected to the appropriate output inductor 30 and works as a cathode of the discharge while the other magnetron is connected to positive output 36 of DC source 16 and works effectively as an anode, with the exception, of course, of switching transition periods of the switching blocks. As discussed above, however, it is also possible to adjust switching times such that the duration of positive and negative going pulses or half cycles provided by each leg as well as the switching interval in between are different.

In the unipolar mode, output of each of the two legs is connected via a diode (not shown in FIG. 1) in output switching block 34, via common output terminal 22 to the same one cathode, and the switch timing is such that there is a time interval during which inductor outputs 33 of both legs are connected to positive output 36 of DC Source 16. During this interval, anode switching block 24 couples the system anode to negative output 38 of the DC electrical power source 16 so that reverse bias voltage is applied between the cathode and the anode.

An intermediate voltage block (IVB) 26 includes circuitry for absorbing current flowing from anode switching block 24, and from current regulation and output switching blocks 32 and 34, at a controlled voltage level (which is lower than the output voltage of DC source 16) and for returning the absorbed voltage, while returning energy into the DC Source. In essence, IVB 26 is a booster or step-up switch-mode voltage regulator, which converts electrical energy from a low input voltage to a higher output voltage. It is controlled in such a manner as to keep the input voltage at a preset level. In prior art voltage controller arrangements of this type, output voltage rather than input voltage is controlled.

The level of the preset input voltage can be any value between the positive 36 and negative 38 terminal values of DC source 16 and may be optimized for either highest efficiency and or lowest operating cost of power supply 10. The optimal input voltage level may vary depending on discharge voltage, output power, and other discharge parameters. One or both of the of the inputs 21 and 27 may be bypassed directly to negative terminal 38 of DC source 16 for all or part of the operation time of power supply 10 in order to optimize performance and reduce load on circuit elements of IVB 26. One suitable circuit arrangement for IVB 26 is described in detail hereinbelow. A control circuit 29 includes a microprocessor and is programmed to provide necessary pulsed control signals (illustrated as groups by arrows PCS) to all switching blocks of circuit 10, in accordance with operator input control parameters and setpoints, and device input monitor signals.

Current monitoring devices 23 are located at inductor 30 of each of legs 12 and 14.. Signals (designated IMS in FIG. 1) from these current monitoring devices are fed to control circuit 29 and used by the control circuit to regulate the respective current levels and/or power levels flowing to the magnetrons as discussed above. Current monitoring devices 23 are also located at output terminals 18 and 22. Signals IMS from these two current monitoring devices, together with signals (designated VMS in FIG. 1) from voltage monitoring devices 25 are also supplied to control circuit 29 and used to monitor output waveforms and to provide accurate measurement of power. It should be noted here, that control circuit 29 may be an integral part of power supply 10, or may be an external computing device provided with appropriate connections to the power supply for monitoring and control.

Figure 5:
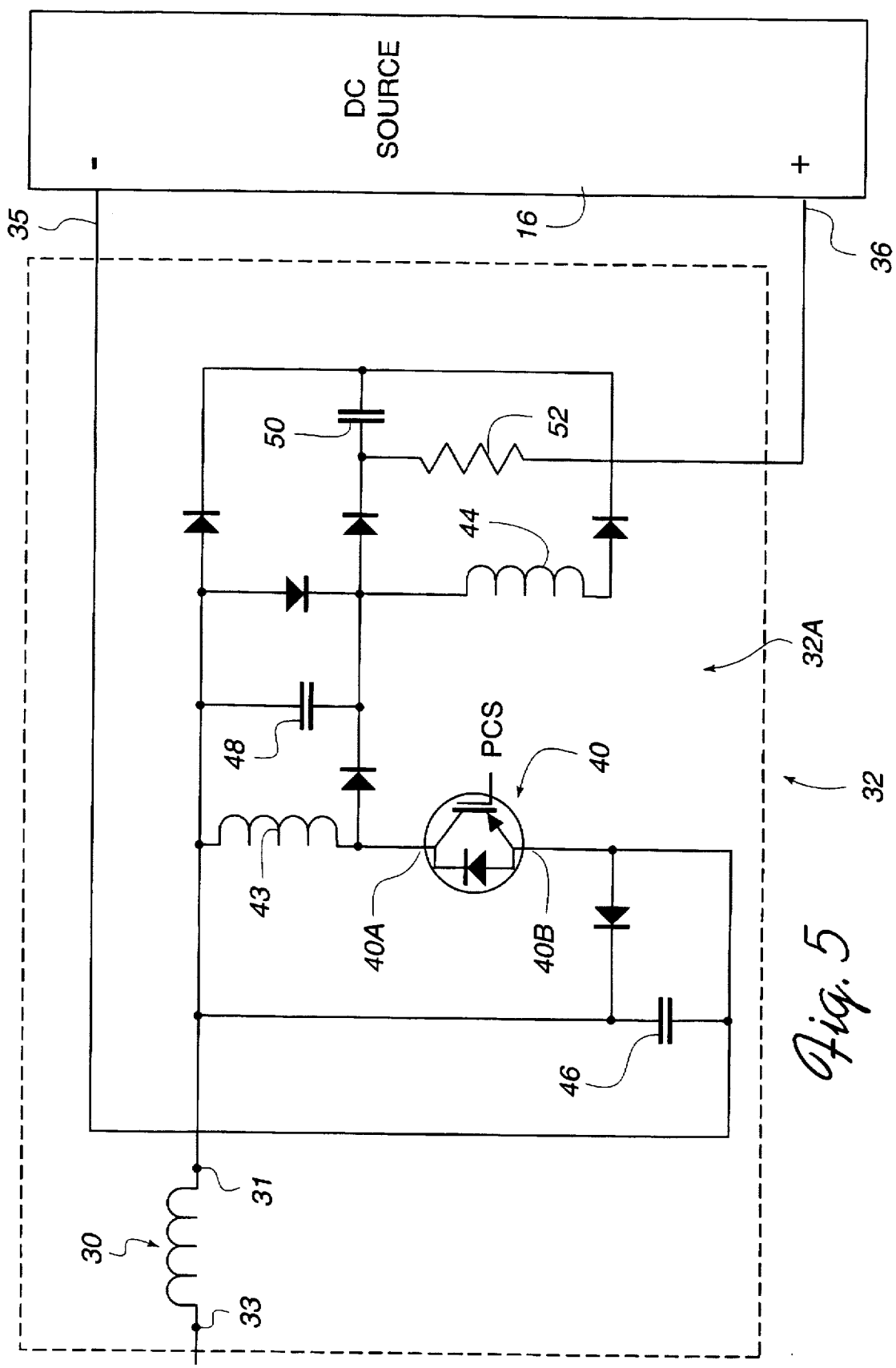
FIG. 5 is a circuit diagram schematically illustrating connections and components of a current regulation or voltage conversion circuit block of the power supply of FIG. 1.

Referring now to FIG. 5, components and connections of a current regulating or voltage conversion circuit block 32 are shown. Current regulation block 32 is the circuit responsible converting voltage output from DC electrical power source 16 to a source of regulated current. The regulated current is delivered via output inductor 30 thereof. Circuitry 32A of current regulation block 32 includes switching element 40, which can be any kind of controllable active semiconductor switching device, for example an IGBT, a MOSFET, or a GTO thyristor. Preferably, it is a 3rd generation IGBT, manufactured by the POWEREX corporation of Youngwood, Pa. The term active switching device, here, is used to clearly differentiate switching element 40, and similar elements discussed hereinafter, from passive elements, such as diodes, which are known to have some limited switching functionality.

Circuitry 32A includes, two inductors 42 and 44, three capacitors 46, 48, and 50, a resistor 52 and seven diodes. These diodes merely limit current flow to a particular direction, which will be evident to those familiar with the art to which the present invention pertains. Accordingly, the diodes are not specifically numbered or functionally described in this or any other circuit discussed herein.

Switching device 40 periodically connects inductor 30, via inductor 43, to negative output 38 of DC source 16 (as discussed above with reference to FIG. 1) to keep current flowing in the inductor at a preset level. The device also disconnects the inductor when connection is not required. The preset level is set by a user in current regulating mode. Alternatively, the preset level is calculated by the microprocessor of control circuit 29, for a user supplied power level, in power regulating mode. Thus, while in a power regulating mode, power supplied to inductor 30, and eventually to a connected magnetron, is controlled by controlling current. It should be noted here, that output inductor 30 functions not only as an element for converting voltage to current in current regulation block 32, but also serves to limit arc current when a magnetron is being operated by power supply 10.

Inductor 43, connected between input end 31 of output resistor 30 and one side 40A of switching device 40, limits transient rate of rise of current at a closing or connecting transition of switching device 40, i.e. when switching device 40 is turned on. Capacitor 46, connected between input end 31 of output resistor 30 and opposite side 40B of switching device 40, limits transient rate of rise of voltage at an opening or disconnecting transition of switching device 40 when the device is turned off. Turning switching device 40, and other like devices on and off, as discussed here and elsewhere in this description, is accomplished by the above-discussed PCS signals from control circuit 29 applied to the gate or base of the device, as indicated in corresponding illustrations. When switching device 40 is turned off, current in inductor 43 decreases to zero while charging capacitor 48, which is subsequently discharged via inductor 44. Capacitor 50 clamps peak voltage on capacitor 48 to a safe level and is discharged via resistor 52.

Interconnection and function of inductors, capacitors, and diodes discussed above and depicted in FIG. 5 is specifically arranged such that current regulation or voltage conversion block 32 can function with only one active, active controllable semiconductor switching element. Prior art devices for converting voltage to regulated current require at least two such active elements and are thus more expensive to produce than circuit block 32.

Figure 6:
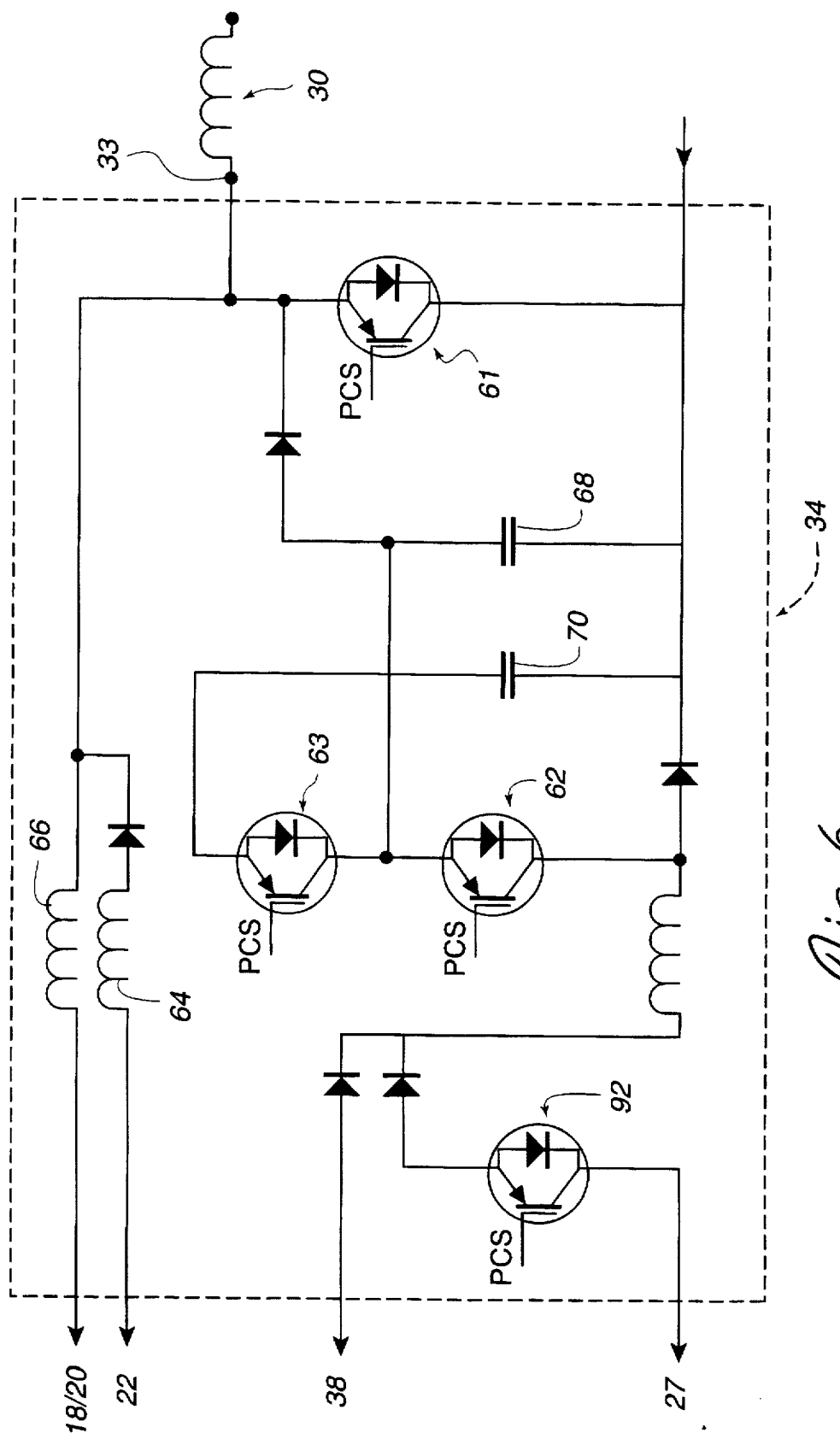
FIG. 6 is a circuit diagram schematically illustrating connections and components of an output switching circuit block of the power supply of FIG. 1.

Continuing now with reference to FIG. 6, output switching block 34 includes four switching elements 61, 62, 63, and 92 that can be any kind of controlled switching devices discussed above, but are preferably a POWEREX 3rd generation IGBT. Switching devices 61, 62 and 63 have corresponding drive circuitry including two inductors 64, 66, and 67, two capacitors 68 and 70 and six diodes. Main switching element 61 is connected between inductor 30 and positive output 36 of the DC source 16 (see FIG. 1). Inductors 64 and 66 limit rate of current rise at switch-on of switching device 61, while capacitor 68 limits rate of voltage rise when switching device 61 is turned off. Capacitor 70 clamps the voltage spike produced by opening of switching device 61 to a safe level. Switching devices 62 and 63 are controlled in such a manner that they discharge capacitors 68 and 70 via inductor 67, into intermediate voltage block 26 (see FIG. 1) when switching device 61 is on. Inductor 69 limits current in switching elements 62 and 63 during discharge of capacitors 68 and 70. When switching device 92 is turned on, output switching block 34 is coupled to intermediate voltage block 26 via terminal 27. When switching device 92 is turned off, coupling is transferred to negative terminal 38 of DC electrical power source 16.

Figure 7:
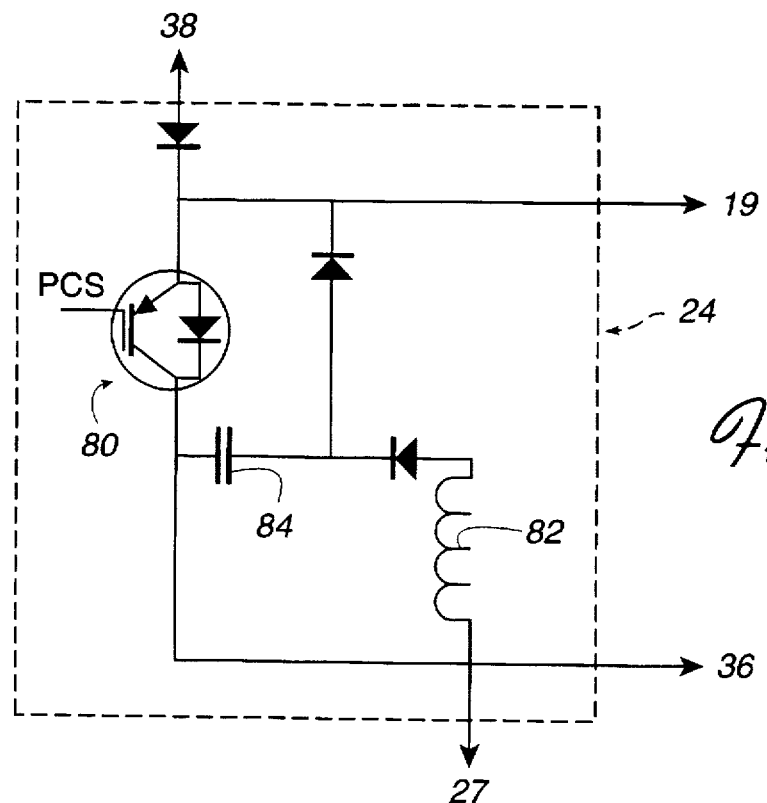
FIG. 7 is a circuit diagram schematically illustrating connections and components of an anode switching circuit block of the power supply of FIG. 1.

Referring now to FIG. 7, components and connections of anode switching block 24 are shown. Here, a switching device 80, which, as described above, can be essentially any type of controllable semiconductor switching device but is preferably a POWEREX 3rd generation IGBT. Associated driving circuitry includes an inductor 82, a capacitor 84 and three diodes. Capacitor 84 limits rate of rise of voltage on switching element 80. Capacitor 84 is discharged into the intermediate voltage block 26 (see FIG. 1) via inductor 82.

Figure 8:
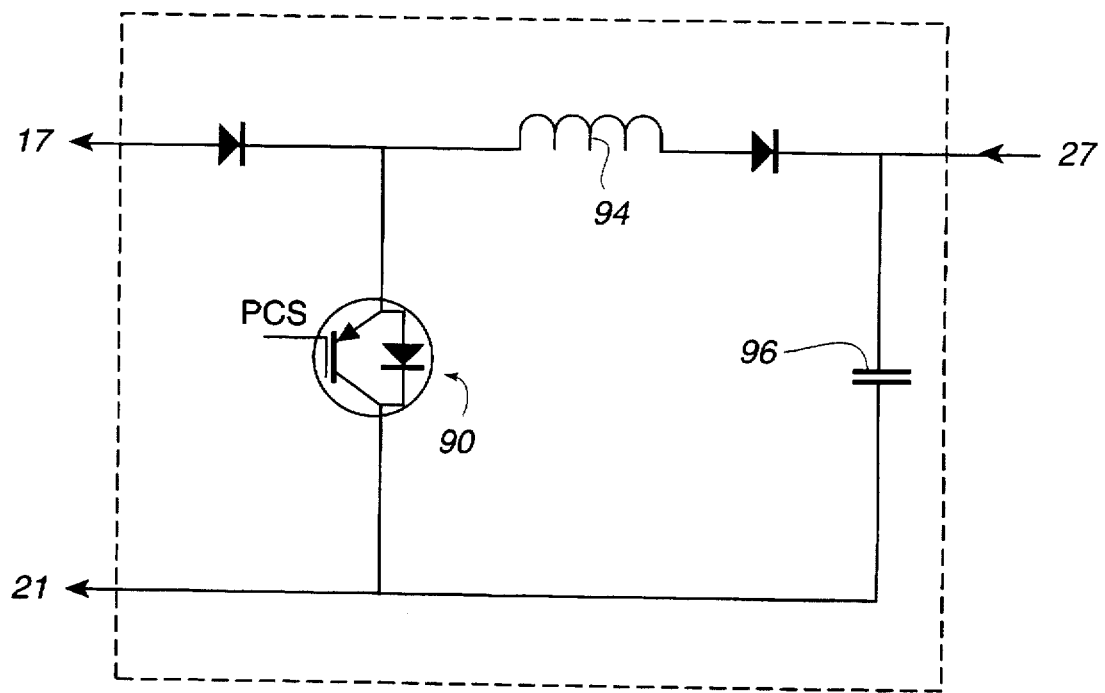
FIG. 8 is a circuit diagram schematically illustrating a connections and components of an intermediate voltage block of FIG. 1.

Referring now to FIG. 8 and again to FIG. 1, a preferred arrangement of components and connections for IVB 26 is illustrated. IVB 26 includes a switching device 90. This switching device, as with other such switching devices discussed above, may be any kind of controllable semiconductor switches and is preferably a POWEREX third generation IGBT. IVB 26 includes two independent diodes which serve to control the direction of current flow. As the function of these diodes would be evident from their depiction to one familiar with the art to which the present invention pertains, they are not enumerated or described in detail.

Switching element 90 pumps energy via an inductor 94 from capacitor 96 back to DC source 16, and is pulse width modulated in such a manner as to keep voltage on capacitor 96 at a desired level between negative and positive potentials of the DC source output terminals 36 and 38. Capacitor 96 is charged by currents flowing from anode switching block 24 and from output switching block 34. The anode switching block is coupled to capacitor 96 directly (via terminal 27). Output switching blocks 34 are periodically connected by switching devices 92 therein to IVB 26 as discussed above.

Those skilled in the art to which the present invention pertains will recognize that while the present invention has been described above primarily in terms of a magnetron power supply configured for operating, alternatively, two magnetrons in a bipolar mode, or one magnetron in a unipolar mode, this configuration is not restricting. Those skilled in the art will recognize that fundamental circuit blocks of the invention are applicable to providing an apparatus which is configured to operate only in a bipolar mode, i.e., without those circuit elements and interconnections provided for alternatively driving one magnetron in a unipolar mode. It will also be recognized that apparatus in accordance with the present invention may be configured for operation in only a unipolar mode, for example, in a configuration including only one current pulse circuit (12 or 14).

Those skilled in the art will also recognize that while the invention has been described as apparatus for driving one or more magnetron sputtering devices, in a simplest aspect, it can be considered as simply a means for providing a train of regulated, generally square-wave, current pulses of adjustable duty cycle and frequency from a DC source of electrical power, which may be an unregulated such source. The pulses need not be positive and negative going as described above, but may be of the same polarity, and may be used for driving any device for which such an electrical current pulse train provides a suitable driving means.

The present invention has been described in terms of a preferred and other embodiments. The invention, however is not limited to the embodiments described and depicted. Rather, the invention is limited only by the claims appended hereto.

What is claimed is:

1. Apparatus for supplying power to first and second magnetron sputtering devices operating in a bipolar mode, the apparatus comprising:

first and second current pulse circuits, each thereof connected at an input end thereof to a source of DC electrical power having a positive voltage output and a negative voltage output;

said first and second current pulse circuits each having voltage converter means for converting said positive and negative output voltages of said DC electrical power source to a supply of regulated electrical current, said voltage converter means including an output inductor, an output end of which is arranged to be at negative potential when current is flowing therein;

said first and second current pulse circuits each including output switching circuitry, said output switching circuitry having first and second inputs connected to respectively an output end of said output inductor and to said positive voltage output of said DC electrical power source, and having an output terminal connectable to a corresponding one of said first and second magnetron sputtering devices; and said output switching circuitry of each of said first and second current pulse circuits including means for switching said output means thereof alternatively and periodically to said output end of said output inductor or to said positive voltage output of said DC electrical power source, thereby providing a train of regulated positive and negative going electrical current pulses at said output means.

2. The apparatus of claim 1, wherein each of said current pulse circuits is controllable for sequentially switching said output terminal of said output switching means thereof to said output end of said output inductor and to said positive voltage output of said DC electrical power source for respectively first and second time-periods, said first and second time-periods having a switching time period therebetween, said first, second, and switching time-periods being independently variable.

3. Apparatus for supplying electrical power to first and second magnetron sputtering devices operating cooperatively in a bipolar mode, or, alternatively, to only a third magnetron sputtering device operating in a unipolar mode, the apparatus comprising:

first and second current pulse circuits each thereof connected at an input end thereof to a source of DC electrical power at a positive voltage output thereof and at a negative voltage output thereof;

programmable control means connected to at least said first and second current pulse circuits, for controlling said first and second current pulse circuits;

said first current pulse circuit connectable at an output end thereof to the first magnetron sputtering device, and said second current pulse circuit connectable at an output end thereof to the second magnetron sputtering device;

each of said first and second current pulse circuits arranged to convert said positive and negative voltage outputs of said DC electrical power source to respectively first and second trains of sequentially positive and negative going regulated electrical current pulses, said current pulses for applying sequentially positive electrical potential and negative electrical potential to a corresponding one of the first and second magnetrons, each of said positive going pulses having a first pulse duration, each of said negative going pulses having a second pulse duration, and said sequential positive and negative going pulses having a switching time therebetween;

said control circuit means programmed such that in each of said pulse switching circuits, said first and second pulse durations and said switching time therebetween are independently adjustable;

said first and second current pulse circuits being connectable at said output ends thereof to a common output terminal, said common output terminal connectable to the third magnetron, and said pulse switching circuits being controllable to deliver a third train of positive and negative going current pulses, via said common output terminal, to the third magnetron, for applying sequentially a positive and a negative potential thereto.

4. The apparatus of claim 3, further including an anode switching circuit, said anode switching circuit connected to said negative voltage output of said DC electrical power source, said anode switching circuit having an anode output terminal, said anode output terminal connectable to an electrode serving as an anode for the third magnetron, and said control circuit means being additionally connected to said third switching circuit and programmed to switch said anode output terminal to said negative voltage output of said DC electrical power source during a said positive going current pulse.

5. The apparatus of claim 4, wherein each of said first and second current pulse circuits each include means for limiting rate of rise of current and voltage between successive current pulses.

6. Apparatus for providing a train of electrical current pulses from a DC source of electrical power, the pulses for driving an electrical device, the apparatus comprising:
    means for converting voltage output from said source of DC power to a supply of regulated direct current, said voltage converting means having first and second input means connected to respectively first and second voltage outputs of said DC power source;
    said voltage converting means including an output inductor, said output inductor periodically connectable via current regulating circuitry to said first voltage output of said DC electrical power source; and
    output switching circuitry having first and second inputs connected respectively to an output end of said output inductor and to said second voltage output of said DC power source, and having an output terminal connectable to a device to be driven, said output switching circuitry including means for alternatively switching said output terminal thereof to said output end of said output inductor or to said second voltage output of said DC electrical power source, thereby providing the train of current pulses at said output terminal of said output switching circuitry.

7. The apparatus of claim 6 wherein said output switching circuitry includes means for limiting rise of current and voltage at said output terminal thereof during a switching transition.

8. The apparatus of claim 7 wherein said current and voltage limiting means are respectively inductive and capacitive.

9. Apparatus for providing a regulated electrical current supply to an electrically driven device, comprising:
    a DC source of electrical power having first and second voltage outputs;
    a voltage conversion and regulating circuit having first and second inputs connected to respectively said first and second voltage outputs;
    a programmable control device connected to said voltage conversion and regulating circuit for delivering control signals thereto;

said voltage conversion and regulating circuit including inductor means for converting said voltage outputs to output current, and including only one active, semiconductor switching device, said semiconductor switching device controllable by said control signals for periodically connecting and disconnecting said first voltage input respectively to and from said inductive voltage conversion means, thereby regulating said output current; and
    said voltage conversion and regulating circuit including inductive means for limiting current rise rate in said inductive voltage conversion means during a connecting transition of said semiconductor switching device, and including capacitive means for limiting voltage rise rate at said inductive voltage conversion means during a disconnecting transition of said semiconductor switching device.

10. Apparatus for providing a regulated electrical current supply to an electrically driven device, comprising:
    a DC source of electrical power having first and second voltage output terminals;
    a voltage conversion and regulating circuit having first and second inputs connected to respectively said first and second voltage output terminals;
    a programmable control device connected to said voltage conversion and regulating circuit for delivering control signals thereto;
    said voltage conversion and regulating circuit including only one active, semiconductor switching device, said semiconductor switching device controllable by said control signals for periodically closing and opening said semiconductor switching device;
    said voltage conversion and regulating circuit including a first inductor, said first inductor having an output end and an input end, said output end connectable to the electrical driven device, and said input end connected via a second inductor to one side of said semiconductor switching device;
    said voltage conversion and regulating circuit including a capacitor, said capacitor connected between said input end of said first inductor and an opposite side of said semiconductor switching device;
    wherein closing said semiconductor switching device connects said first voltage output of said DC electrical power source via said second inductor to said first inductor and opening said semiconductor switching device disconnects said first voltage output of said DC electrical power source from said first inductor, controlled opening and closing of said semiconductor switching device by said control signals being means by which current flowing in said first inductor is regulated; and
    wherein said second inductor limits rate of rise of current in first inductor at a closing transition of said semiconductor switching device, and said capacitor limits rate of rise of voltage at said first inductor at an opening transition of said semiconductor switch.

* * * * *